United States Patent
Nojima et al.

(10) Patent No.: US 11,451,227 B2
(45) Date of Patent: Sep. 20, 2022

(54) CONTROL CIRCUITRY FOR POWER SEMICONDUCTOR SWITCHES USING CONTROL SIGNAL FEEDBACK

(71) Applicant: Eaton Intelligent Power Limited, Dublin (IE)

(72) Inventors: Geraldo Nojima, Fort Mill, SC (US); Eddie Wilkie, Fletcher, NC (US)

(73) Assignee: Eaton Intelligent Power Limited

(*) Notice: Subject to any disclaimer, the term of this patent is extended or adjusted under 35 U.S.C. 154(b) by 0 days.

(21) Appl. No.: 16/862,926

(22) Filed: Apr. 30, 2020

(65) Prior Publication Data

US 2021/0344342 A1     Nov. 4, 2021

(51) Int. Cl.
    *H03K 17/693*     (2006.01)
    *H03K 17/22*     (2006.01)
    *H01L 29/20*     (2006.01)
    *H01L 29/16*     (2006.01)

(52) U.S. Cl.
    CPC ....... *H03K 17/693* (2013.01); *H01L 29/1608* (2013.01); *H01L 29/2003* (2013.01); *H03K 17/223* (2013.01)

(58) Field of Classification Search
    CPC .......................... H03K 17/693; H03K 17/223
    USPC ........................................................ 327/434
    See application file for complete search history.

(56) References Cited

U.S. PATENT DOCUMENTS

| | | | | |
|---|---|---|---|---|
| 6,057,728 A * | 5/2000 | Igarashi | ............. | H03K 17/0828 327/546 |
| 6,094,087 A * | 7/2000 | He | .................. | H03K 17/04123 327/434 |
| 7,126,802 B2 * | 10/2006 | Ishikawa | ............ | H03K 17/0828 361/94 |
| 8,952,730 B2 * | 2/2015 | Kihara | ................. | H03K 17/687 327/108 |
| 9,322,852 B2 * | 4/2016 | Chen | ...................... | H03K 17/00 |
| 2004/0027762 A1 * | 2/2004 | Ohi | .................. | H03K 17/08128 361/100 |
| 2009/0002054 A1 * | 1/2009 | Tsunoda | .......... | H03K 17/08128 327/374 |

(Continued)

FOREIGN PATENT DOCUMENTS

EP      2632046      8/2013

OTHER PUBLICATIONS

Nagaoka, et al.; *High-Speed Gate Drive Circuit for SiC MOSFET by GaN HEMT*; IEICE Electronics Express, vol. 12, No. 11; (2015) pp. 11-18.

(Continued)

*Primary Examiner* — Metasebia T Retebo

(74) *Attorney, Agent, or Firm* — Stanek Lemon Crouse & Meeks, P.A.

(57) ABSTRACT

An apparatus includes a power semiconductor switch, a driver circuit configured to drive a control terminal of the power semiconductor switch, and a control circuit configured to apply a control signal to the driver circuit responsive to a comparison of a reference voltage to a voltage at the control terminal of the semiconductor switch. In some embodiments, the power semiconductor switch may include a field effect transistor (FET), such as a wide bandgap silicon carbide (SiC) MOSFET. The control terminal may include a gate terminal of the FET, and the voltage at the control terminal may include a gate voltage.

11 Claims, 5 Drawing Sheets

(56) References Cited

U.S. PATENT DOCUMENTS

| | | | |
|---|---|---|---|
| 2012/0126859 A1* | 5/2012 | Kawamoto | H03K 17/163 |
| | | | 327/108 |
| 2018/0115310 A1* | 4/2018 | Horiguchi | G01R 31/27 |
| 2019/0123546 A1* | 4/2019 | Wang | H02M 1/08 |
| 2019/0245531 A1* | 8/2019 | Heil | H02H 9/00 |
| 2019/0267793 A1 | 8/2019 | Hematy | |
| 2020/0259488 A1* | 8/2020 | Thalheim | H02H 3/08 |

OTHER PUBLICATIONS

Partial European Search Report for EP21171047, dated Dec. 8, 2021, 51 pages.

* cited by examiner

CONTROL CIRCUITRY FOR POWER SEMICONDUCTOR SWITCHES USING CONTROL SIGNAL FEEDBACK

BACKGROUND

The inventive subject matter relates to electrical power apparatus and methods and, more particularly, to driver circuits for power semiconductor switches.

Semiconductor switches, such as insulated gate bipolar transistors (IGBTs) and power metal-oxide-semiconductor field-effect transistors (MOSFETs), are used in a variety of different types of electrical power applications, such as in rectifiers, inverters, motor drives and the like. Solid state circuit breakers incorporating such semiconductor switches have also been developed, with the semiconductor switches being used to replace the electromechanical switches traditionally used in such devices. In such applications, semiconductor switches offer advantages of speed and resistance to environmental degradation.

In some applications, it is desirable to have tight alignment in turn-on and turn-off of multiple semiconductor switches. For example, in operations in which power semiconductor switches are operated in series. However, disparities in characteristics of the inverter transistors, such as variances in threshold voltage and gate capacitance, can lead to variances in device turn-on and turn-off times among devices, which may cause one of the series connected semiconductor switches to carry the entire voltage. Similarly, in applications that operate multiple semiconductor switches in parallel in order to increase current carrying capacity, relatively small disparities in device parameters, such as turn-on resistance and threshold voltage, can lead to nonuniform current distribution among the paralleled devices. Such current maldistribution can lead to device overload and failure. Such problems can be particularly acute due to exceeding device capability for wide bandgap semiconductor switches, such as silicon carbide (SiC) power transistors, which may be operated at switching frequencies and/or voltage levels that are significantly greater than those used for conventional silicon devices.

SUMMARY

According to some embodiments, an apparatus includes a power semiconductor switch, a driver circuit configured to drive a control terminal of the power semiconductor switch, and a control circuit configured to apply a control signal to the driver circuit responsive to a comparison of a reference voltage to a voltage at the control terminal of the semiconductor switch. In some embodiments, the power semiconductor switch may include a field effect transistor (FET), such as a wide bandgap silicon carbide (SiC) MOSFET. The control terminal may include a gate terminal of the FET, and the voltage at the control terminal may include a gate voltage.

In some embodiments, the driver circuit may include a totem-pole circuit and the control circuit may apply the control signal to control terminals of first and second transistors of the totem-pole circuit. The power semiconductor switch may include a field effect transistor (FET), the control terminal may include a gate terminal of the FET, and the voltage at the control terminal may include a gate voltage of the FET. The FET may include a wide bandgap FET and the first and second transistors may include respective wide bandgap transistors. For example, the FET may include a SiC MOSFET and the first and second transistors of the totem-pole circuit may include respective gallium nitride (GaN) transistors.

According to further aspects, the control circuit may include a reference voltage generator configured to generate the reference voltage responsive to a drive signal and the reference voltage may conform to a reference voltage profile stored by the reference voltage generator. The reference voltage profile may be adjustable. The apparatus may further include a reference voltage profile generator configured to adjust the reference voltage profile responsive to a sensed parameter of the power semiconductor switch.

In further embodiments, the power semiconductor switch may include a first power semiconductor switch, the driver circuit may include a first driver circuit, the control circuit may include a first control circuit configured to apply a control signal to the first driver circuit responsive to a comparison of a first reference voltage to a first voltage at the control terminal of the first semiconductor switch, and the apparatus may further include a second power semiconductor switch coupled in series or in parallel with the first semiconductor switch, a second driver circuit configured to drive a control terminal of the second power semiconductor switch, and a second control circuit configured to apply a control signal to the second driver circuit responsive to a comparison of a second reference voltage to a voltage at the control terminal of the second semiconductor switch.

In some embodiments of the inventive subject matter, and apparatus includes a wide bandgap power transistor, a totem-pole circuit configured to drive the wide bandgap power transistor, and a control circuit configured to apply a control signal to the totem-pole circuit responsive to a comparison of a voltage at a control terminal of the wide bandgap power transistor to a reference voltage. The control circuit may include a reference voltage generator configured to generate the reference voltage responsive to a drive signal and the reference voltage may conform to a reference voltage profile stored by the reference voltage generator. The reference voltage profile may be adjustable. The apparatus may further include a reference voltage profile generator configured to adjust the reference voltage profile responsive to a sensed parameter of the wide bandgap power transistor.

In still further embodiments, an apparatus includes a wide bandgap FET and a driver circuit comprising at least one wide bandgap gate driving transistor coupled to a gate terminal of the wide bandgap FET and controlled responsive to a voltage at the gate terminal of the wide bandgap FET. The apparatus further includes a control circuit configured to compare a voltage at the gate terminal of the wide bandgap FET to a reference voltage and to apply a control signal to the driver circuit responsive to the comparison.

DETAILED DESCRIPTION

Figure 1:
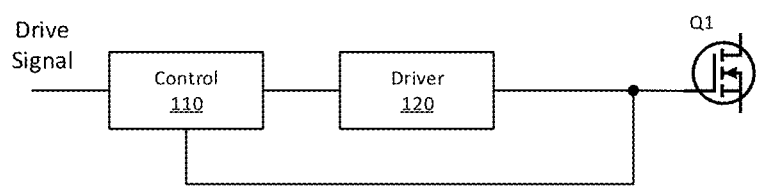
FIG. 1 is a schematic diagram of a circuit for controlling a power MOSFET switch according to some embodiments.

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like items. It will be understood that when an item is referred to as being "connected" or "coupled" to another item, it can be directly connected or coupled to the other item or intervening items may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, items, and/or components, but do not preclude the presence or addition of one or more other features, integers, steps, operations, items, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

Some embodiments of the inventive subject matter arise from a realization that closed-loop control of switching times of series and/or parallel-connected power semiconductor switching devices may be particularly advantageous in certain applications (e.g., SiC-based power MOSFETs and similar devices). According to some aspects, a control signal applied to a control terminal of a semiconductor switch, such as a SiC power MOSFET gate, may be generated based on a comparison of a voltage applied to the control terminal to a reference voltage, which may be generated from a profile that can be calibrated for the particular power transistor. This comparison enables producing a continuously regulated control signal to compensate for the individual characteristics of each semiconductor forcing it to behave in a predetermined manner according to the generated profile. Thus, for example, operations of series and/or parallel connected power MOSFETs having slightly different device parameters can be aligned by controlling the control signals applied to the MOSFETs based on continuous gate voltage feedback.

FIG. 1 illustrates circuitry for controlling a power MOSFET Q1 according to some embodiments. A gate terminal of the MOSFET Q1 is driven by driver circuit 120, which may be, for example, a totem-pole or other push-pull circuit. A control circuit 110 applies a control signal to the driver circuit 120 responsive to a drive signal that represents a desired state of the MOSFET Q1, e.g., "on" or "off." The control circuit 110 generates the control signal applied to the driver circuit 120 responsive to a comparison of a voltage at the gate terminal of the MOSFET Q1 to a reference voltage that is generated responsive to the drive signal applied to the control circuit. In some embodiments, the control signal applied to the driver circuit 120 may follow a predetermined profile that provides a desired voltage waveform for the gate voltage of the MOSFET Q1.

Figure 2:
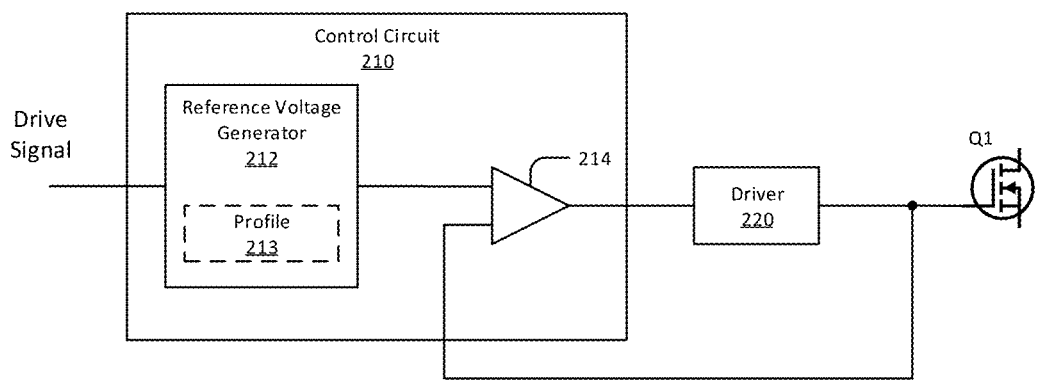
FIG. 2 is a schematic diagram of a circuit for controlling a power MOSFET switch according to some embodiments.

FIG. 2 illustrates such a control circuit 210 according to further embodiments. The control circuit 210 includes a comparison circuit 214 (e.g., a hysteresis current regulator), which receives a reference voltage signal from a voltage reference generator circuit 212 and compares the reference voltage signal to a feedback signal corresponding to a voltage at a gate terminal of a MOSFET Q1 and regulates to the desired output on a continuous basis utilizing current regulation. The reference voltage signal is generated to drive a desired switch state transition for the MOSFET Q1, e.g., a transition from "on" to "off" or vice versa. As shown, the reference voltage may conform to a reference voltage profile 213 that corresponds to a desired dynamic behavior of the voltage applied to the gate terminal of a MOSFET Q1 driven by a driver circuit 120 for the transition commanded by the drive signal. The profile 213 may be implemented using, for example, an analog or digital function generator circuit which provides a desired dynamic response to the reference voltage signal applied to the comparison circuit 214 such that the gate voltage of the MOSFET Q1 exhibits a corresponding behavior in response to a state transition of the drive signal applied to the control circuit 210. The profile 213 may be adjustable responsive to a control input, such as a calibration input. This allows for individualized tuning of the operation of the driver circuit 120 to compensate for the particular characteristics of the MOSFET Q1 being driven.

Figure 3:
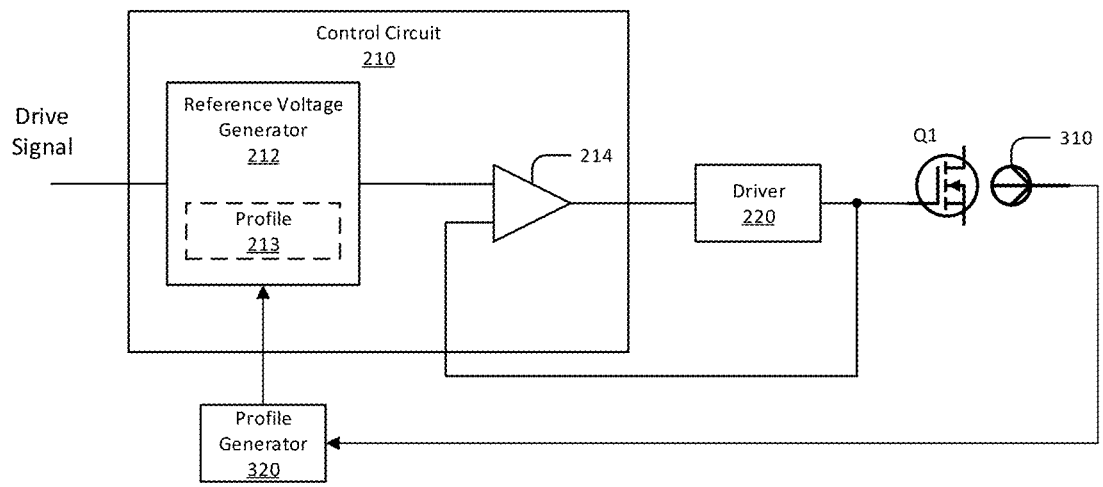
FIG. 3 is a schematic diagram of a circuit for controlling a power MOSFET switch according to some embodiments.

Referring to FIG. 3, in some embodiments, a reference voltage profile may be adjusted responsive to a feedback information relating to behavior of the MOSFET Q1 being driven. A sensor circuit 310 may detect certain real time operational parameters of the MOSFET Q1, such as on-state voltage, turn-on time, turn-off time, and the like. A profile generator circuit 320 may receive one or more sensor signals from the sensor circuit 310 representative of these parameters. Such information may include, for example, information indicative of turn-on and/or turn-off times of the MOSFET Q1 in relation to a timing reference. The voltage profile 213 of the control circuit 210 can be adjusted based on these sensed parameters to enable more precise alignment of the turn-on and/or turn-off times of the MOSFET Q1 with respect to the timing reference.

Figure 4:
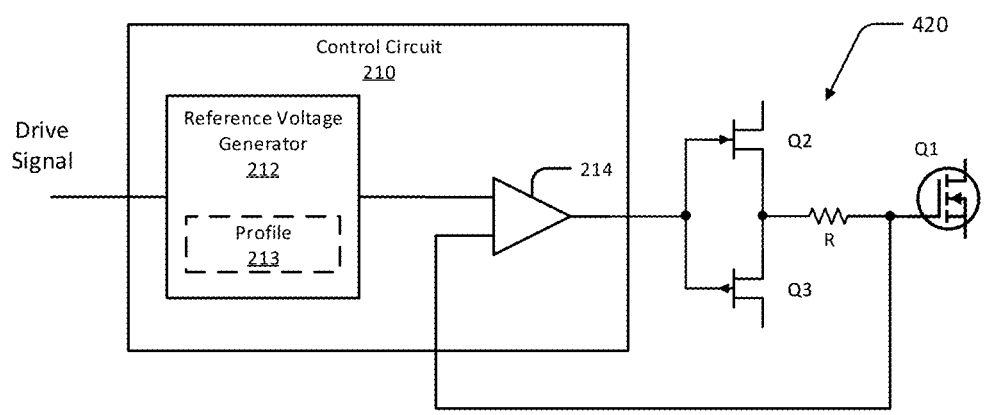
FIG. 4 is a schematic diagram of a circuit for controlling a power MOSFET switch according to some embodiments.

As illustrated in FIG. 4, a driver circuit used to drive a MOSFET Q1 may be a totem-pole circuit 420 that includes first and second transistors Q2, Q3 arranged in a half-bridge configuration and driven by a common control signal generated by a control circuit 210 along the lines described above with reference to FIG. 2. In some embodiments, the driver circuit transistors Q2, Q3 may be devices that are capable of significantly faster response than the speeds at which it is desired to switch the MOSFET Q1 being driven, such that the gate voltage applied to the MOSFET Q1 can be controlled as described above without the driver circuit transistors Q2, Q3 introducing undesirable delay. For example, in some embodiments, the MOSFET Q1 may be a wide bandgap MOSFET, such as a silicon carbide (SiC)

MOSFET, and the transistors Q2, Q3 may be wide bandgap devices capable of operating at even higher frequencies, such as gallium nitride (GaN) transistors.

As shown, the transistors Q2, Q2 of the totem-pole driver circuit 420 may be driven by a control circuit 210 that generates a control signal that drives the transistors Q2, Q3 responsive to, for example, the output of a hysteresis current regulator commanded by the comparison between a gate voltage of the MOSFET Q1 and a reference voltage regulator profile. Along the lines discussed above with reference to FIG. 2, the control circuit 210 includes a comparison circuit 214, which receives a voltage reference voltage signal from a reference voltage generator circuit 212. The reference voltage signal is generated responsive to a drive signal indicating a desired switch state transition for the MOSFET Q1, e.g., a transition from "on" to "off" or vice versa. The reference voltage signal conforms to a reference voltage profile 213 that identifies a desired dynamic behavior of the voltage applied to the gate terminal of a MOSFET Q1 driven by the totem-pole driver circuit 420.

Figure 5:
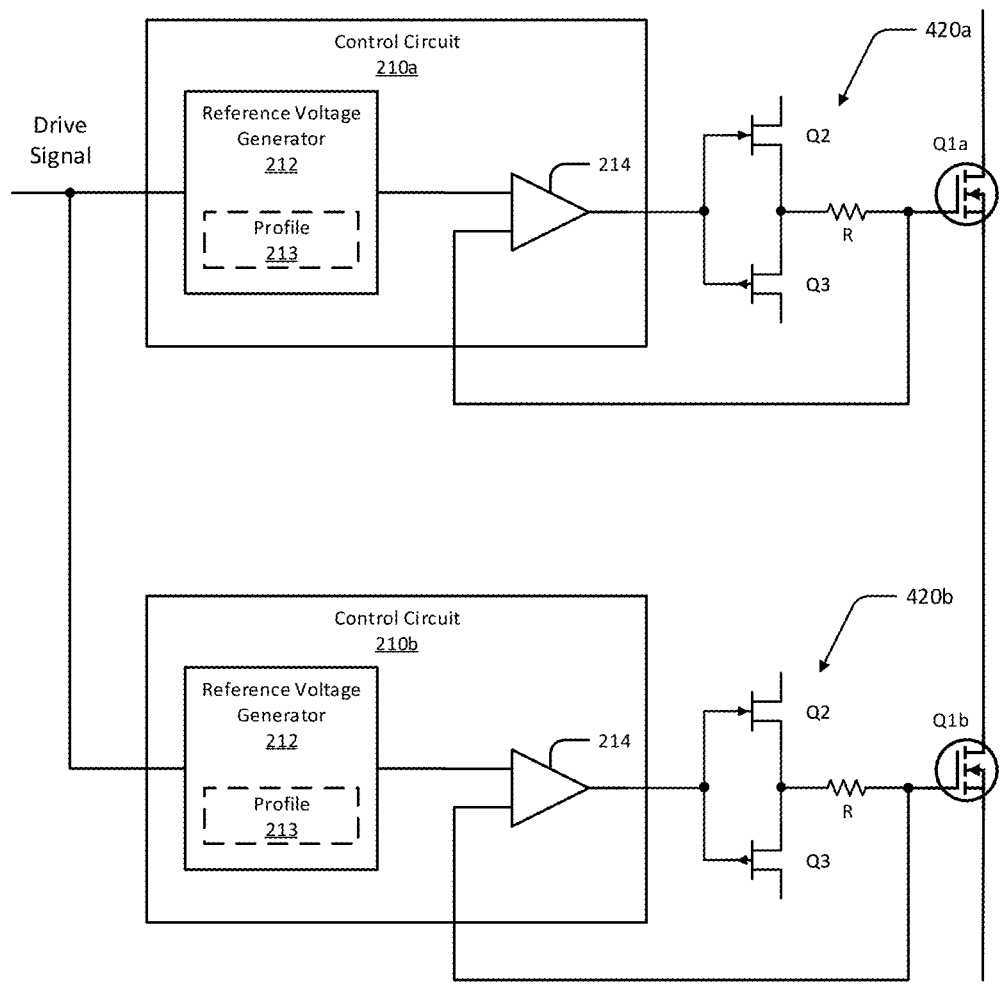
FIGS. 5 and 6 are schematic diagrams illustrating use of the control circuit of FIG. 4 in applications involving control of series-connected power MOSFET switches according to some embodiments.

FIG. 5 illustrates application of such control circuitry to an application in which first and second serially-connected MOSFETs Q1a, Q1b are driven in unison. A first control circuit 210a controls application of a control signal to a first totem-pole driver circuit 420a that drives the first MOSFET Q1a. A similar second control circuit 210b controls application of a control signal to a second totem-pole driver circuit 420b that drives the second MOSFET Q1b. Along the lines discussed above, the first and second control circuits 210a, 210b may implement the same reference voltage profile 213 that can be set to adjust transitions of the MOSFETs Q1a, Q1b such that non-simultaneous operation may be reduced or eliminated, thus compensating, for example, for disparities in operating parameters of the first and second MOSFETs Q1a, Q1b.

Figure 6:
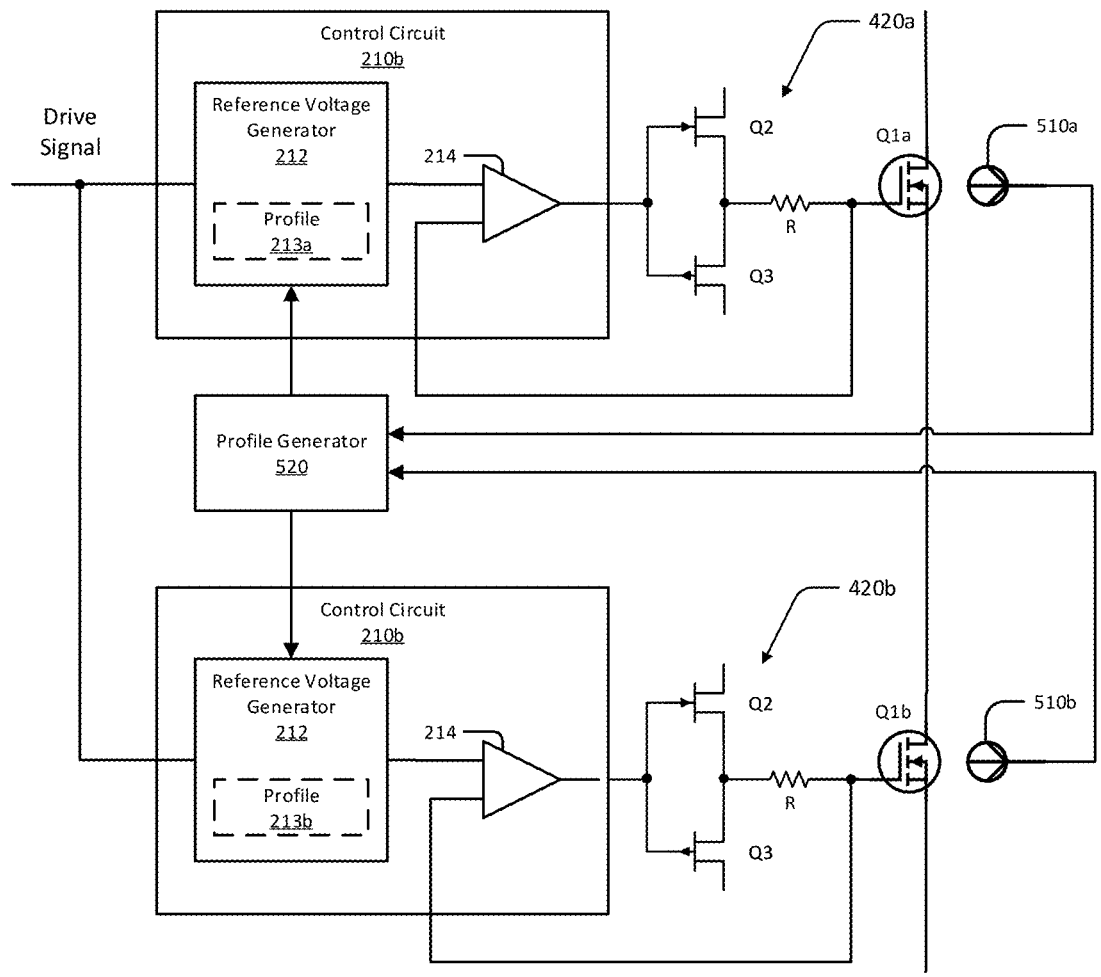

As shown in FIG. 6, a reference voltage profile generator 520 may receive sensor feedback from sensor circuits 510a, 510b associated with respective ones of the MOSFETs Q1a, Q1b and adjust profiles 213a, 213b for reference voltage generators 212 of respective control circuits 210a, 201b responsive to the sensor feedback. The profile generator 520 may, for example, adjust gate drive signals applied to the MOSFETs Q1a, Q1b such that identical or nearly identical switching times can be achieved.

Figure 7:
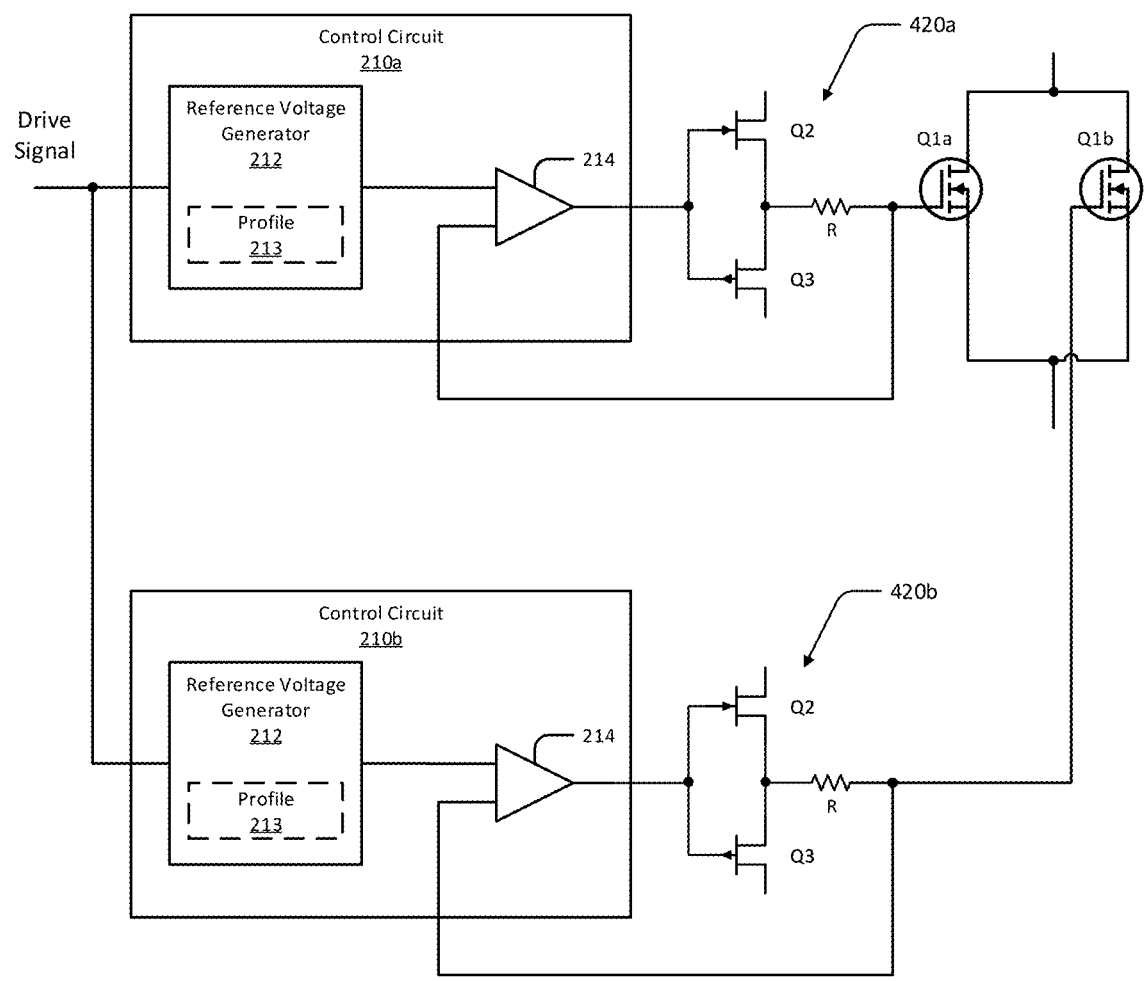
FIG. 7 is a schematic diagram illustrating use of the control circuit of FIG. 3 in an application involving control of parallel-connected power MOSFET switches according to some embodiments.

According to further embodiments illustrated in FIG. 7, arrangements similar to that illustrated in FIG. 5 may be used in applications in which first and second MOSFETs Q1a, Q1b are operated in a parallel-connected fashion. In particular, a single reference voltage profile 213 may be used by respective control circuits 210a, 210b that drive respective totem-pole driver circuits 420a, 420b that drive the first and second MOSFETs Q1a, Q1b. The profile 213 may be adjusted such that, for example, the "on" and "off" times of the first and second MOSFETS Q1a, Q1b are substantially aligned, thus enabling reduction or elimination of current imbalances between the first and second MOSFETs Q1a, Q1b.

The drawings and specification, there have been disclosed exemplary embodiments of the inventive subject matter. Although specific terms are employed, they are used in a generic and descriptive sense only and not for purposes of limitation, the scope of the inventive subject matter being defined by the following claims.

That which is claimed:
1. An apparatus comprising:
   a first power semiconductor switch;
   a second power semiconductor switch coupled in series or in parallel with the first semiconductor switch;
   a first driver circuit configured to drive a control terminal of the first power semiconductor switch responsive to a first control signal;
   a second driver circuit configured to drive a control terminal of the second power semiconductor switch responsive to a second control signal;
   a first control circuit configured to generate the first control signal responsive to a drive signal that commands transitions of the first and second semiconductor switches between off and on states in unison, the first control circuit generating the first control signal according to a comparison of a voltage at the control terminal of the first semiconductor switch to a first reference voltage that varies for transitions of the first semiconductor switch between the off and on states in a manner defined by a first predetermined profile to provide a desired dynamic behavior for the voltage at the control terminal of the first semiconductor switch for the transitions of the first semiconductor switch between the off and on states; and
   a second control circuit configured to generate the second control signal responsive to the drive signal, the second control circuit generating the second control signal according to a comparison of a voltage at the control terminal of the second semiconductor switch to a second reference voltage that varies for transitions of the second semiconductor switch between the off and on states in a manner defined by a second predetermined profile to provide a desired dynamic behavior for the voltage at the control terminal of the second semiconductor switch for the transitions of the second semiconductor switch between the off and on states.

2. The apparatus of claim 1, wherein the first and second power semiconductor comprise respective field effect transistors (FETs), wherein the control terminals of the first and second semiconductor switches comprise gate terminals, and wherein the voltages at the control terminals of the first and second semiconductor switches comprise gate voltages.

3. The apparatus of claim 2, wherein the FETs comprise wide bandgap FETs.

4. The apparatus of claim 3, wherein the FETs comprise silicon carbide (SiC) MOSFETs.

5. The apparatus of claim 1, wherein the first and second driver circuits comprise respective totem-pole circuits and wherein the first and second control circuits apply the first and second control signals to control terminals of first and second transistors of the totem-pole circuits.

6. The apparatus of claim 5, wherein the first and second power semiconductor switches comprise respective FETs, wherein the control terminals of the first and second semiconductor switches comprise gate terminals, and wherein the voltages at the control terminals of the first and second semiconductor switches comprise gate voltages.

7. The apparatus of claim 6, wherein the FETs comprise wide bandgap FETs and wherein the first and second transistors comprise wide bandgap transistors.

8. The apparatus of claim 7, wherein the FETs comprise SiC MOSFETs and wherein the first and second transistors of the totem-pole circuits comprise gallium nitride (GaN) transistors.

9. The apparatus of claim 1, wherein the first control circuit comprises a first reference voltage generator configured to generate the first reference voltage responsive to the drive signal, wherein the first reference voltage conforms to a first reference voltage profile stored by the first reference voltage generator, wherein the second control circuit comprises a second reference voltage generator configured to generate the second reference voltage responsive to the drive signal, and wherein the second reference voltage conforms to a second reference voltage profile stored by the second reference voltage generator.

10. The apparatus of claim 9, wherein the first and second reference voltage profiles are adjustable.

11. The apparatus of claim 10, further comprising a reference voltage profile generator configured to adjust the first and second reference voltage profiles responsive to sensed parameters of the first and second power semiconductor switches.

\* \* \* \* \*